(12) United States Patent
Kikuchi et al.

(10) Patent No.: US 10,707,830 B2
(45) Date of Patent: Jul. 7, 2020

(54) ELASTIC WAVE DEVICE AND METHOD FOR MANUFACTURING THE SAME

(71) Applicant: Murata Manufacturing Co., Ltd., Nagaokakyo-shi, Kyoto-fu (JP)

(72) Inventors: Taku Kikuchi, Nagaokakyo (JP); Seiji Kai, Nagaokakyo (JP); Motoji Tsuda, Nagaokakyo (JP); Mitsuyoshi Hira, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 606 days.

(21) Appl. No.: 15/376,816

(22) Filed: Dec. 13, 2016

(65) Prior Publication Data

US 2017/0093366 A1 Mar. 30, 2017

Related U.S. Application Data

(63) Continuation of application No. PCT/JP2015/068206, filed on Jun. 24, 2015.

(30) Foreign Application Priority Data

Jun. 27, 2014 (JP) ................................ 2014-132402

(51) Int. Cl.
*H03H 9/02* (2006.01)
*H03H 3/08* (2006.01)
(Continued)

(52) U.S. Cl.
CPC .......... *H03H 9/02984* (2013.01); *H03H 3/08* (2013.01); *H03H 9/02637* (2013.01);
(Continued)

(58) Field of Classification Search
CPC .. H03H 9/02984; H03H 3/08; H03H 9/02637; H03H 9/058; H03H 9/059; H03H 9/1071; H03H 9/64
See application file for complete search history.

(56) References Cited

U.S. PATENT DOCUMENTS

2008/0266023 A1  10/2008  Tanaka
2010/0225202 A1*  9/2010  Fukano ................. H03H 9/059
                                                                     310/313 C
(Continued)

FOREIGN PATENT DOCUMENTS

JP    2000-101239 A    4/2000
JP    2008-124785 A    5/2008
(Continued)

OTHER PUBLICATIONS

Official Communication issued in corresponding Japanese Patent Application No. 2016-529630, dated Mar. 27, 2018.
(Continued)

*Primary Examiner* — Bryan P Gordon
(74) *Attorney, Agent, or Firm* — Keating & Bennett, LLP

(57) ABSTRACT

An elastic wave device includes a piezoelectric substrate, functional electrodes on the piezoelectric substrate, a support layer on the piezoelectric substrate with a frame shape surrounding the functional electrodes, a cover member on the support layer to seal an opening of the support layer, the cover member including a first main surface facing the support layer, and a second main surface opposite to the first main surface. Recesses are located in the cover member and are open to the second main surface. Via holes extend through the support layer and to bottom surfaces of the recesses of the cover member, the via holes each including an opening that is open to the bottom surface. The area of the opening of each of the via holes is not more than the area of the bottom surface of the corresponding recess of the cover (Continued)

member. First via conductor portions are provided in the via holes and second via conductor portions are provided in the recesses of the cover member.

13 Claims, 6 Drawing Sheets

(51) Int. Cl.
    *H03H 9/10*     (2006.01)
    *H03H 9/05*     (2006.01)
    *H03H 9/64*     (2006.01)

(52) U.S. Cl.
    CPC ............ *H03H 9/058* (2013.01); *H03H 9/059* (2013.01); *H03H 9/1071* (2013.01); *H03H 9/64* (2013.01)

(56) References Cited

U.S. PATENT DOCUMENTS

| | | | | |
|---|---|---|---|---|
| 2011/0140808 A1* | 6/2011 | Kurahashi | ............ | H03H 9/0222 333/193 |
| 2011/0234055 A1* | 9/2011 | Fukano | .............. | H03H 9/02897 310/365 |
| 2014/0118084 A1 | 5/2014 | Takemura | | |
| 2014/0368084 A1* | 12/2014 | Fukano | .............. | H03H 9/02897 310/313 B |
| 2015/0194948 A1 | 7/2015 | Inate | | |
| 2016/0277003 A1* | 9/2016 | Kikuchi | .................... | H03H 3/08 |
| 2017/0309679 A1* | 10/2017 | Kawasaki | ............... | H01L 24/16 |
| 2018/0131345 A1* | 5/2018 | Fukuda | ................ | H03H 9/1071 |

FOREIGN PATENT DOCUMENTS

| | | |
|---|---|---|
| JP | 2009-124378 A | 6/2009 |
| JP | 2012-074462 A | 4/2012 |
| WO | 2007/083432 A1 | 7/2007 |
| WO | 2009/057699 A1 | 5/2009 |
| WO | 2013/008435 A1 | 1/2013 |
| WO | 2014/050307 A1 | 4/2014 |
| WO | 2014/077239 A1 | 5/2014 |

OTHER PUBLICATIONS

Official Communication issued in corresponding International Application PCT/JP2015/068206, dated Aug. 18, 2015.

\* cited by examiner

ELASTIC WAVE DEVICE AND METHOD FOR MANUFACTURING THE SAME

CROSS REFERENCE TO RELATED APPLICATIONS

This application claims the benefit of priority to Japanese Patent Application No. 2014-132402 filed on Jun. 27, 2014 and is a Continuation Application of PCT Application No. PCT/JP2015/068206 filed on Jun. 24, 2015. The entire contents of each application are hereby incorporated herein by reference.

BACKGROUND OF THE INVENTION

1. Field of the Invention

The present invention relates to an elastic wave device and a method for manufacturing the elastic wave device.

2. Description of the Related Art

In the related art, elastic wave devices have been widely used.

For example, in a surface acoustic wave device described in Japanese Unexamined Patent Application Publication No. 2008-124785, via electrodes are provided so as to extend through a support layer, which is provided on a piezoelectric substrate, and a cover member, which is disposed on the support layer. Each of the via electrodes includes a first via electrode portion and a second via electrode portion that extends to the first via electrode portion. The first via electrode portions extend through the support layer. The second via electrode portions extend through the cover member. In Japanese Unexamined Patent Application Publication No. 2008-124785, the diameter of each of the second via electrode portions is larger than the diameter of each of the first via electrode portions.

In the related art, as described in Japanese Unexamined Patent Application Publication No. 2008-124785, the contact areas between via electrodes and outer electrodes need to be large in order to improve thermal shock resistance and the like. However, in Japanese Unexamined Patent Application Publication No. 2008-124785, the lower ends of the second via electrode portions, each of which is connected to a corresponding one of the outer electrodes and each of which has a large diameter, are in contact with the support layer. In other words, since the cross-sectional area of a lower end portion of each of the second via electrode portions is large, the dimension of the support layer, which is located below the second via electrode portions, in a width direction also needs to be large. Meanwhile, the surface acoustic wave device includes a hollow portion that is formed of the piezoelectric substrate, the support layer, and the cover member. The plane area of the hollow portion needs to be sufficiently large in order to accommodate IDT electrodes, a filter circuit including IDT electrodes, and the like. However, in Japanese Unexamined Patent Application Publication No. 2008-124785, since the dimension of the support layer in the width direction needs to be large, it is difficult to facilitate a reduction in the size of the surface acoustic wave device.

SUMMARY OF THE INVENTION

Preferred embodiments of the present invention provide an elastic wave device that is significantly reduced in size.

An elastic wave device according to a preferred embodiment of the present invention includes a piezoelectric substrate, a functional electrode that is disposed on the piezoelectric substrate, a support layer that is disposed on the piezoelectric substrate so as to surround the functional electrode, and a cover member that is disposed on the support layer so as to seal an opening of the support layer and that includes a first main surface, which is a main surface of the cover member facing the support layer, and a second main surface that is opposite to the first main surface. A recess is provided in the cover member and is open to the second main surface. A via hole extends through the support layer and to extend to a bottom surface of the recess of the cover member, the via hole having an opening that is open to the bottom surface. An area of the opening of the via hole is not greater than an area of the bottom surface of the recess of the cover member. The elastic wave device further includes a first via conductor portion that is provided in the via hole and a second via conductor portion that is provided in the recess of the cover member.

In an elastic wave device according to another preferred embodiment of the present invention, the support layer and the cover member are integrally formed by the same material to define a unitary member.

In an elastic wave device according to another preferred embodiment of the present invention, a bump is bonded to an end portion of the second via conductor portion, the end portion being opposite to an end portion of the second via conductor portion that faces the first via conductor portion.

In an elastic wave device according to another preferred embodiment of the present invention, the cover member includes first and second cover members. The first cover member is disposed on the support layer, and the second cover member is disposed on the first cover member.

In an elastic wave device according to another preferred embodiment of the present invention, the recess of the cover member is provided in the second cover member so as not to extend to the first cover member.

A method for manufacturing an elastic wave device according to a preferred embodiment of the present invention includes preparing an elastic wave element that includes a functional electrode that is disposed on a piezoelectric substrate, a support layer that is disposed on the piezoelectric substrate so as to surround the functional electrode, and a cover member that is disposed on the support layer so as to seal an opening of the support layer and that includes a first main surface, which is a main surface of the cover member facing the support layer, and a second main surface that is opposite to the first main surface, the cover member including a recess that is open to the second main surface of the cover member, and in which a via hole extends through the support layer and to extend to a bottom surface the recess of the cover member and forming a first via conductor portion and a second via conductor portion in the via hole and in the recess of the cover member, respectively, by filling the via hole and the recess of the cover member with a conductive material. In a process of forming the via hole, the via hole is formed such that an area of an opening of the via hole, the opening facing the recess of the cover member, is not more than an area of the bottom surface of the recess.

A method for manufacturing an elastic wave device according to another preferred embodiment of the present invention further includes bonding a bump to an end portion of the second via conductor portion, the end portion being opposite to an end portion of the second via conductor portion that faces the first via conductor portion.

In a method for manufacturing an elastic wave device according to another preferred embodiment of the present invention, the cover member includes first and second cover members, and, in the preparing of the elastic wave element, the cover member is disposed on the support layer such that the first cover member is located on a side on which the first main surface of the cover member is present.

In a method for manufacturing an elastic wave device according to another preferred embodiment of the present invention, in the preparing of the elastic wave element, the recess of the cover member is formed in the second cover member so as not to extend to the first cover member.

In a method for manufacturing an elastic wave device according to another preferred embodiment of the present invention, in the preparing of the elastic wave element, a resist pattern is formed on the second main surface of the cover member by a photolithography method, and the recess is formed by etching so as to be open to the second main surface of the cover member.

According to various preferred embodiments of the present invention, a further reduction in the size of the elastic wave device is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to the drawings to clarify the present invention.

Figure 1:
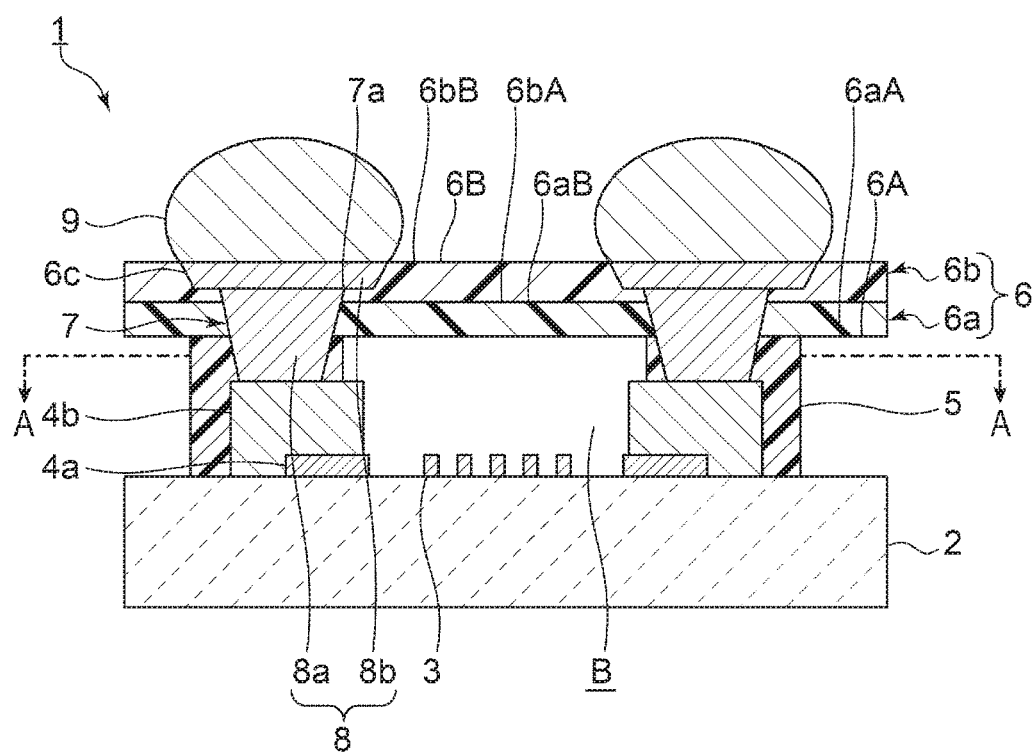
FIG. 1 is a schematic sectional front view of an elastic wave device according to a first preferred embodiment of the present invention.
Figure 2:
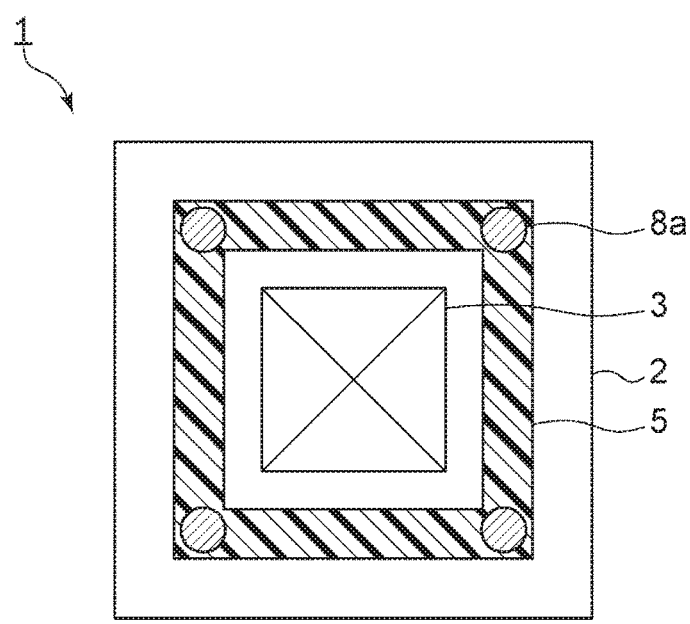
FIG. 2 is a sectional plan view taken along line A-A of FIG. 1.

FIG. 1 is a schematic sectional front view of an elastic wave device according to a first preferred embodiment of the present invention. FIG. 2 is a sectional plan view taken along line A-A of FIG. 1.

An elastic wave device 1 includes a piezoelectric substrate 2. The piezoelectric substrate 2 is made of a piezoelectric single crystal, such as $LiNbO_3$ or $LiTaO_3$. Note that the piezoelectric substrate 2 may be made of a piezoelectric ceramic.

Functional electrodes 3 are provided on the piezoelectric substrate 2. The functional electrodes 3 are made of a suitable metal, such as Al, Cu, Pt, Au, Ni, Mo, W, Ti, Cr, Ag, or Mg, or an alloy. Alternatively, the functional electrodes 3 may be formed by stacking these metals on top of one another. In the present preferred embodiment, the functional electrodes 3 are IDT electrodes. When an AC voltage is applied to the IDT electrodes, a surface acoustic wave is excited by the piezoelectric effect.

Note that the functional electrodes 3 may include reflectors that are disposed at the ends of the IDT electrodes in an elastic-wave propagation direction. Alternatively, the functional electrodes 3 may include a filter circuit including a plurality of IDT electrodes.

First wiring layers 4a that are electrically connected to the functional electrodes 3 are provided on the piezoelectric substrate 2. In addition, second wiring layers 4b are provided on the piezoelectric substrate 2. Each of the second wiring layers 4b is in contact with a corresponding one of the first wiring layers 4a and is electrically connected to the first wiring layer 4a. Each of the first and second wiring layers 4a and 4b is made of a suitable metal or an alloy. The second wiring layers 4b are electrically connected to via conductors, which will be described later, and consequently, the functional electrodes 3 are electrically connected to the outside.

A support layer 5 is provided on the piezoelectric substrate 2 so as to surround the functional electrodes 3. The support layer 5 is also in contact with the second wiring layers 4b. The support layer 5 has a frame shape. The support layer 5 is made of a suitable resin material. Note that the support layer 5, which extends around the functional electrodes 3, is not necessarily closed completely and may be partially open.

A cover member 6 is disposed on the support layer 5 so as to seal an opening of the support layer 5. A hollow portion B is defined by the piezoelectric substrate 2, the support layer 5, and the cover member 6. The functional electrodes 3 are accommodated in the hollow portion B.

The cover member 6 includes a first main surface 6A and a second main surface 6B that is opposite to the first main surface 6A. The first main surface 6A is located on the side on which the support layer 5 is present. In the present preferred embodiment, the cover member 6 includes first and second cover members 6a and 6b. The first cover member 6a is disposed on the support layer 5. The second cover member 6b is stacked on the first cover member 6a. The first and second cover members 6a and 6b respectively include first main surfaces 6aA and 6bA, which are located on the side on which the support layer 5 is present. In addition, the first and second cover members 6a and 6b respectively have second main surfaces 6aB and 6bB. The second main surface 6aB is opposite to the first main surface 6aA, and the second main surface 6bB is opposite to the first main surface 6bA. The first main surface 6aA of the first cover member 6a corresponds to the first main surface 6A of the cover member 6, and the second main surface 6bB of the second cover member 6b corresponds to the second main surface 6B of the cover member 6.

Recesses 6c are provided in the second cover member 6b and are open to the second main surface 6bB. In the present preferred embodiment, the recesses 6c preferably are not in contact with the first cover member 6a. Note that the recesses 6c may be in contact with the first cover member 6a.

In the present preferred embodiment, each of the recesses 6c of the second cover member 6b includes an inclined surface portion that extends to a portion of the recess 6c, the portion being open to the second main surface 6bB. Note that each of the recesses 6c does not need to include the inclined surface portion.

Figure 3:
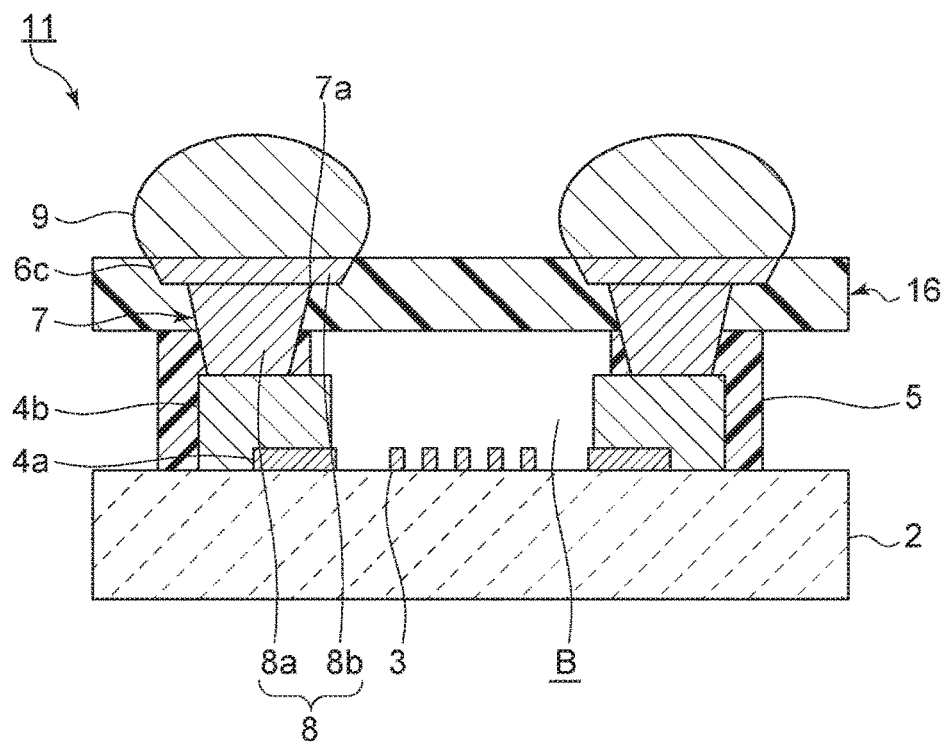
FIG. 3 is a schematic sectional front view illustrating a first modification of the elastic wave device according to the first preferred embodiment of the present invention.

In the present preferred embodiment, the first cover member 6a is a bonding layer made of a viscous resin having an adhesive property. The second cover member 6b is a protective layer made of a resin having chemical resistance. Note that each of the first and second cover members 6a and 6b may be made of a suitable resin that does not have a viscosity, an adhesive property, and chemical resistance. Alternatively, a cover member 16 may be defined by a single resin layer as in an elastic wave device 11, which is a first modification illustrated in FIG. 3.

Returning to FIG. 1, via holes 7 extend through the support layer 5 of the elastic wave device 1. The lower end of each of the via holes 7 is in contact with the top surface of a corresponding one of the second wiring layers 4b. In addition, the via holes 7 extend through the first and second cover members 6a and 6b, and the upper end of each of the via holes 7 is in contact with the bottom surface of a corresponding one of the recesses 6c of the second cover member 6b. Each of the via holes 7 has an opening 7a that is open to the bottom surface of the corresponding recess 6c. The area of each of the openings 7a of the via holes 7 preferably is equal to or smaller than the area of the bottom surface of the corresponding recess 6c of the second cover member 6b. Note that, the "areas of the bottom surfaces of the recesses, which are open to the second main surface of the cover member" refers to the areas of the bottom surfaces of the recesses when the recesses are viewed in plan.

In the present preferred embodiment, each of the via holes 7 includes an inclined surface portion that connects the two end portions of the via hole 7 to each other. Accordingly, the diameter of one of the end portions of the via hole 7, the end portion being located on the side on which the second wiring layers 4b is present, is smaller than the diameter of the other end portion of the via hole 7 located on the side on which the recesses 6c of the second cover member 6b are present. Thus, the cross-sectional area of each of the via holes 7 is highest at the opening 7a. Note that the via holes 7 do not need to include the inclined surface portions.

Via conductors 8 are provided in the via holes 7 and the recesses 6c of the second cover member 6b. Each of the via conductors 8 includes a first via conductor portion 8a, which is provided in a corresponding one of the via holes 7, and a second via conductor portion 8b, which is provided in a corresponding one of the recesses 6c of the second cover member 6b. Each of the first via conductor portions 8a is electrically and physically connected to a corresponding one of the second wiring layers 4b. Note that the second wiring layers 4b do not need to be provided, and the first wiring layers 4a and the corresponding first via conductor portions 8a may be electrically and physically connected to each other. The via conductors 8 are made of a suitable metal, such as Cu, Ag, Au, Sn, Pd, or Ni, or an alloy.

Bumps 9 are bonded to the second via conductor portions 8b of the via conductors 8. Each of the bumps 9 are electrically connected to a corresponding one of the via conductors 8. The elastic wave device 1 is mounted onto a circuit board or the like by using the bumps 9. The bumps 9 are made of a suitable brazing filler metal, such as solder.

Note that the bumps are not essential, and the elastic wave device 1 may be mounted onto a circuit board or the like by not using the bumps 9.

Features of the present preferred embodiment include: the recesses 6c are provided in the second main surface 6bB of the second cover member 6b, and, in each of the via conductors 8, the cross-sectional area of the first via conductor portion 8a is smaller than the cross-sectional area of the second via conductor portion 8b. As a result, the elastic wave device is able to be reduced in size. Further details of this matter will be described below.

In the elastic wave device 1, the hollow portion B preferably has a sufficient planar area in order to encompass the functional electrodes 3. Consequently, in order to reduce the size of the elastic wave device 1, the dimensions of the portions of the elastic wave device 1 excluding the hollow portion B are preferably reduced. In the present preferred embodiment, the second via conductor portions 8b of the via conductors 8 are provided in the corresponding recesses 6c of the second cover member 6b. Thus, when a direction perpendicular to a stacking direction in FIG. 1 is a width direction, the dimension of the support layer 5 in the width direction is independent of the areas of the second via conductor portions 8b. In addition, the cross-sectional area of each of the first via conductor portions 8a is smaller than the cross-sectional area of the corresponding second via conductor portion 8b. Accordingly, the dimension of the support layer 5 in the width direction is able to be significantly reduced or minimized. Therefore, the elastic wave device is able to be reduced in size.

As described above, the dimension of the support layer in the width direction is independent of the areas of the second via conductors 8b. Thus, the cross-sectional areas of the second via conductor portions 8b is able to be sufficiently large without increasing the planar area of the elastic wave device 1. As a result, the bonding areas of the second via conductor portions 8b and the corresponding bumps 9 are able to be sufficiently large. Therefore, the thermal shock resistance of the elastic wave device is able to be effectively improved.

Figure 4:
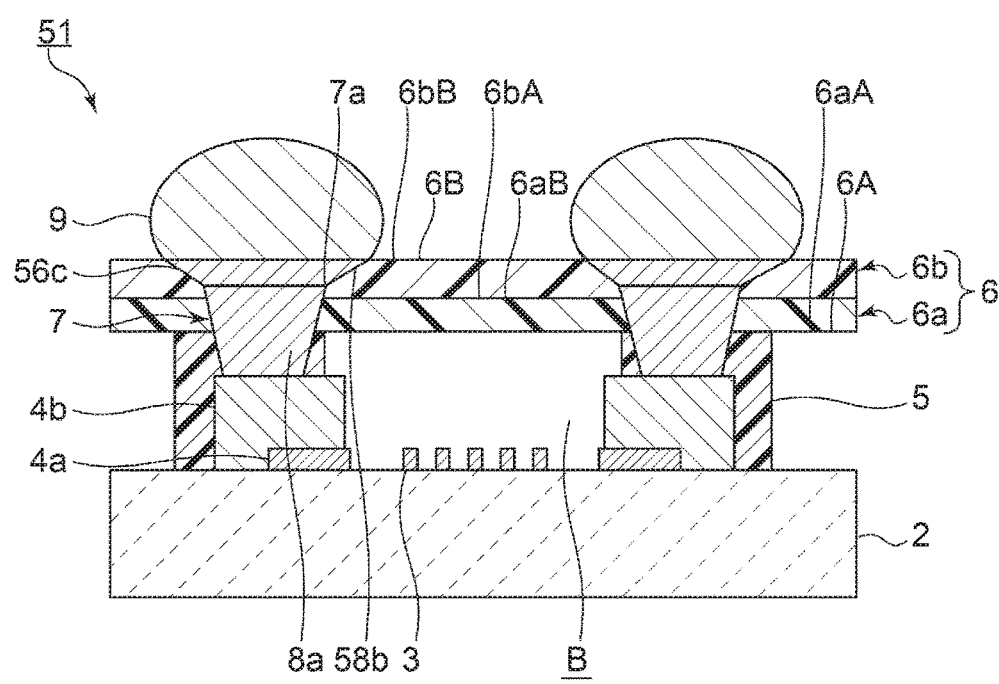
FIG. 4 is a schematic sectional front view illustrating a second modification of the elastic wave device according to the first preferred embodiment of the present invention.

Note that, as in an elastic wave device 51, which is a second modification illustrated in FIG. 4, the areas of the bottom surfaces of recesses 56c of the second cover member 6b, that is, the areas of portions of the recesses 56c where no inclined surface portions are located may each be equal or substantially equal to the area of the opening 7a of the corresponding one of the via holes 7. Also in this case, the cross-sectional areas of the first via conductor portions 8a are smaller than the contact areas between second via conductor portions 58b and the corresponding bumps. Therefore, similar to the first preferred embodiment, the elastic wave device is able to be reduced in size.

Figure 5:
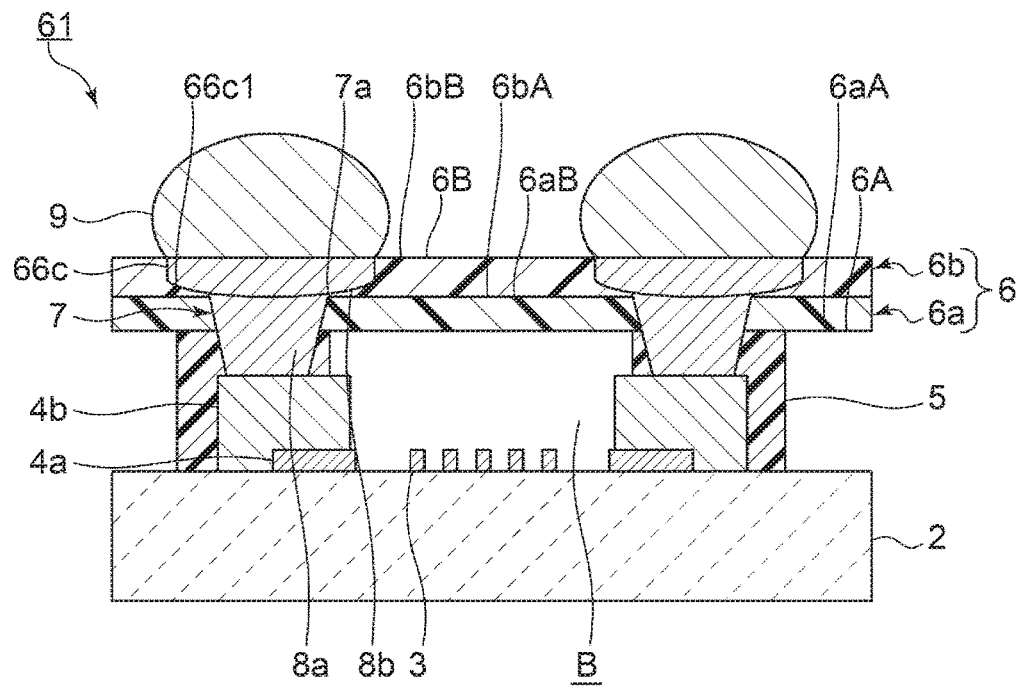
FIG. 5 is a schematic sectional front view illustrating a third modification of the elastic wave device according to the first preferred embodiment of the present invention.

As in an elastic wave device 61, which is a third modification illustrated in FIG. 5, bottom surfaces 66c1 of recesses 66c of the second cover member 6b may each include a curved surface. In this case, advantageous effects similar to those of the first preferred embodiment are able to be obtained.

Figure 6:
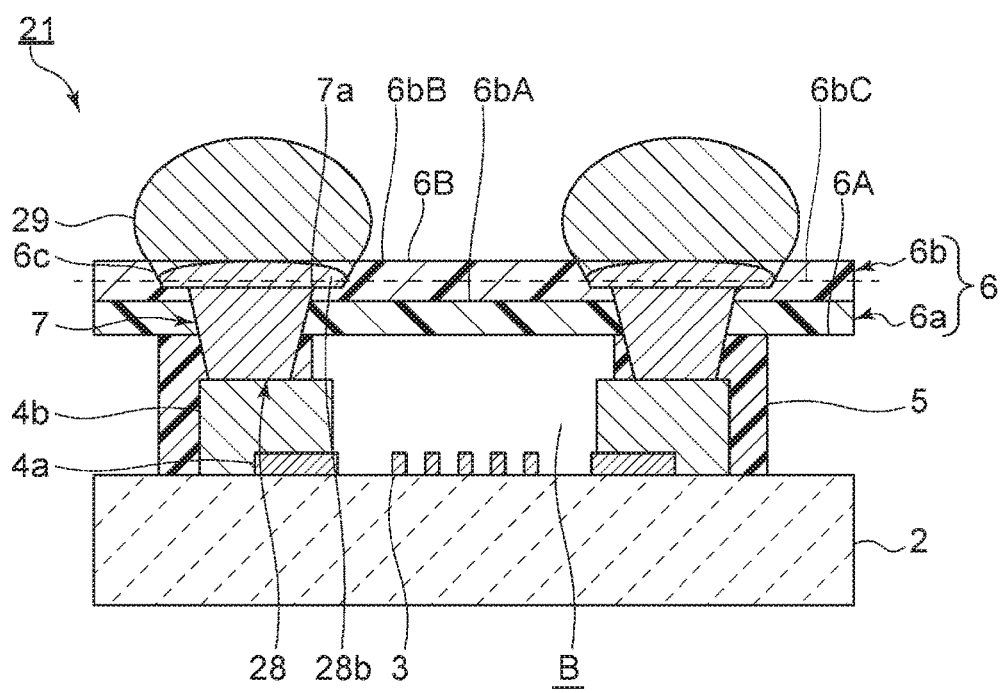
FIG. 6 is a schematic sectional front view illustrating a fourth modification of the elastic wave device according to the first preferred embodiment of the present invention.

As in an elastic wave device 21, which is a fourth modification illustrated in FIG. 6, top surfaces of second via conductor portions 28b of via conductors 28 may each have a protruding shape. As a result, the bonding areas between the via conductors 28 and bumps 29 are able to be further increased. Therefore, the thermal shock resistance of the elastic wave device is able to be still more effectively improved.

Preferably, it is desirable that the levels of the top surfaces of the second via conductor portions 28b be around the level of a center portion 6bC of the second cover member 6b in the thickness direction of the second cover member 6b. Note that at least some of the second via conductor portions 28b may be positioned above the second main surface 6bB of the second cover member 6b in the thickness direction.

In the first preferred embodiment, the first cover member 6a is a bonding layer, and the second cover member 6b is a protective layer. The second cover member 6b is disposed on the support layer 5 with the first cover member 6a interposed therebetween. Thus, the adhesive strength between the support layer 5 and the cover member 6 is able to be improved, and the durability of the elastic wave device 1 with respect to an external impact is able to be improved by the second cover member 6b. In addition, the recesses 6c of the second cover member 6b do not extend to the first cover member 6a. Consequently, the entire second main surface 6aB of the first cover member 6a is covered with the second cover member 6b. As a result, the durability of the elastic wave device 1 is able to be effectively improved. In addition, since the via conductors cover the bottom surfaces of the recesses 6c of the second cover member 6b, which is a protective layer, the chemical resistance is able to be further improved.

Figure 7:
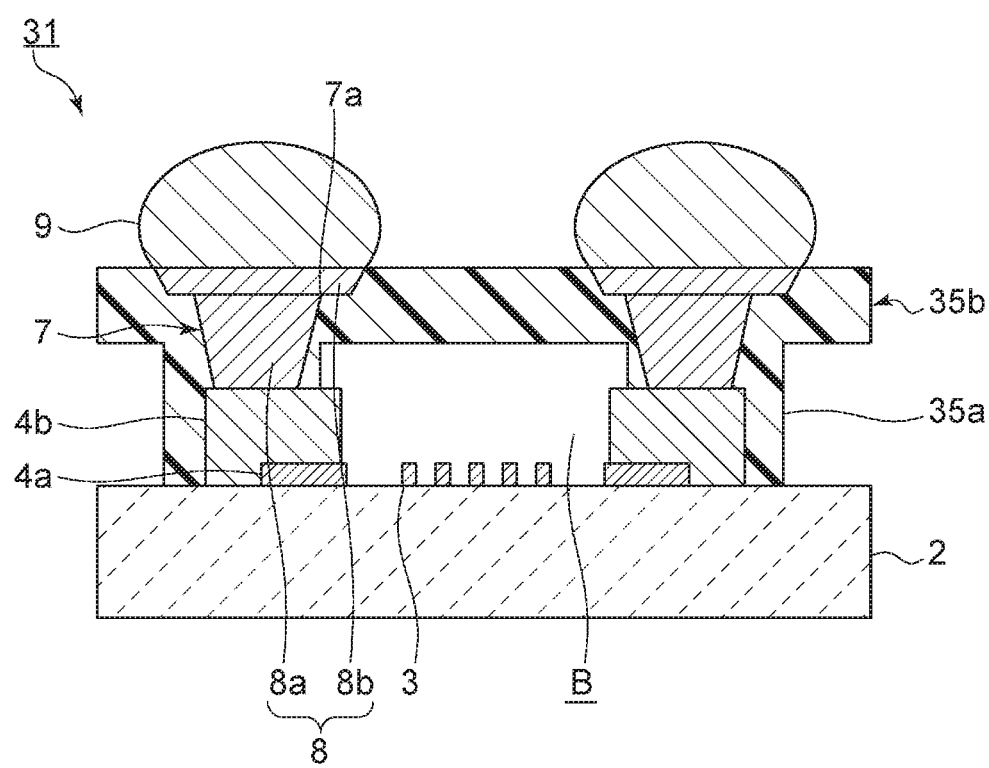
FIG. 7 is a schematic sectional front view illustrating a fifth modification of the elastic wave device according to the first preferred embodiment of the present invention.

Note that, although the support layer 5 and the cover member 6 preferably are provided as different members in the present preferred embodiment, the present invention is not limited to this configuration. As in an elastic wave device 31, which is a fifth modification illustrated in FIG. 7, the support layer and the cover member may be integrally formed of the same material to define a unitary member. In other words, a support layer portion 35a and a cover member portion 35b may be integrally formed and define a unitary member.

A non-limiting example of a method for manufacturing an elastic wave device according to the above-described preferred embodiment will be described below.

First, the functional electrodes 3 are formed on the piezoelectric substrate 2. Next, the first wiring layers 4a that are electrically connected to the functional electrodes 3 are formed. Note that the functional electrodes 3 and the first wiring layers 4a may be formed at the same time. Then, the second wiring layers 4b are formed on the piezoelectric substrate 2 so as to extend to the corresponding first wiring layers 4a. The functional electrodes 3 and the first and second wiring layers 4a and 4b can be formed by, for example, a sputtering method, a CVD method, a vacuum deposition method, or the like.

Note that the piezoelectric substrate 2 is a mother substrate. A plurality of elastic wave devices can be simultaneously formed on the piezoelectric substrate 2.

Next, the support layer 5 is formed on the piezoelectric substrate 2 so as to surround the functional electrodes 3 and to be in contact with the second wiring layers 4b. The support layer 5 is formed so as to have a frame shape. The support layer 5 can be formed by, for example, a photolithography method.

Next, the cover member 6 is disposed so as to seal the opening of the support layer 5. In the present preferred embodiment, the cover member 6 includes the first and second cover members 6a and 6b. As described above, the first cover member 6a is a bonding layer, and the second cover member 6b is a protective layer. The cover member 6 is bonded to the support layer 5 such that the first cover member 6a, which is a bonding layer, is located on the side on which the first main surface 6A of the cover member 6 is present.

The second cover member 6b may be stacked on the first cover member 6a after the first cover member 6a has been disposed on the support layer 5. Alternatively, the cover member 6 may be bonded to the support layer 5 after obtaining the cover member 6 by stacking the first and second cover members 6a and 6b one on top of the other.

Next, the recesses 6c are formed in the second cover member 6b. A method of forming the recesses 6c will now be described with reference to FIGS. 8A to 8C.

Figure 8A:
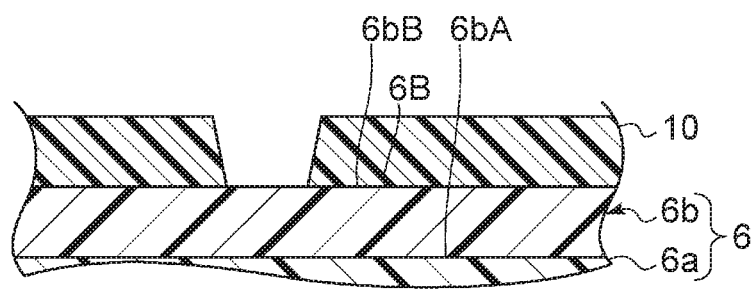
FIGS. 8A to 8C are partially cut-away sectional front views illustrating a method for forming recesses in a cover member by a photolithography method.
Figure 8B:
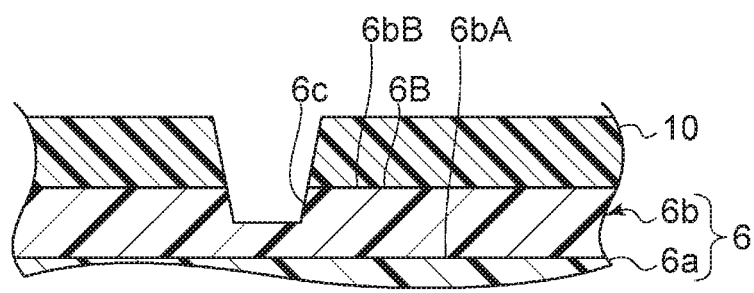
Figure 8C:
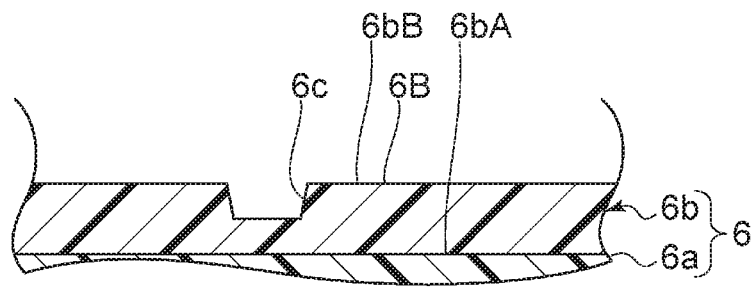

FIGS. 8A to 8C are partially cut-away sectional front views illustrating a method for forming the recesses in the cover member by a photolithography method.

As illustrated in FIG. 8A, a resist pattern 10 is formed on the second main surface 6B of the cover member 6 by a photolithography method. Next, as illustrated in FIG. 8B, the recesses 6c are formed by etching so as to be open to the second main surface 6bB of the second cover member 6b. The recesses 6c are formed so as not to extend to the first cover member 6a. In addition, the inclined surface portions are formed in the recesses 6c. After that, the resist pattern is removed as illustrated in FIG. 8C. Note that the inclined surface portions may be formed at the same time as the recesses 6c are formed or may be formed in a different process. The recesses 6c may extend to the first cover member 6a.

Next, the via holes 7 illustrated in FIG. 1 are formed by radiating a laser beam onto the bottom surfaces of the recesses 6c of the second cover member 6b. The via holes 7 are formed so as to extend through the cover member 6 and the support layer 5 and to extend to the top surfaces of the corresponding second wiring layers 4b. Each of the via holes 7 is formed such that the area of the opening 7a of the via hole 7 is smaller than the area of the bottom surface of the corresponding recess 6c of the second cover member 6b. In addition, the inclined surface portions, each of which extends to the end portions of the corresponding via hole 7, are formed such that the diameter of one of the end portions of the via hole 7, the end portion being located on the side on which the second wiring layers 4b is present, is smaller than the diameter of the other end portion of the via hole 7 located on the side on which the recesses 6c are present. The via holes 7 can be formed by, for example, performing laser beam irradiation. Note that the inclined surface portions may be formed at the same time as the via holes 7 are formed or may be formed in a different process. An elastic wave element can be prepared in the manner described above.

Note that the recesses 6c can also be formed by a method other than a photolithography method. For example, the recesses 6c can also be formed by performing laser beam irradiation. This method can preferably be used particularly when, for example, the cover member 16 is formed of a single resin layer as in the first modification illustrated in FIG. 3. A method for forming the recesses 6c and the via holes 7 by performing laser beam irradiation in the first modification will now be described with reference to FIGS. 9A and 9B.

Figure 9A:
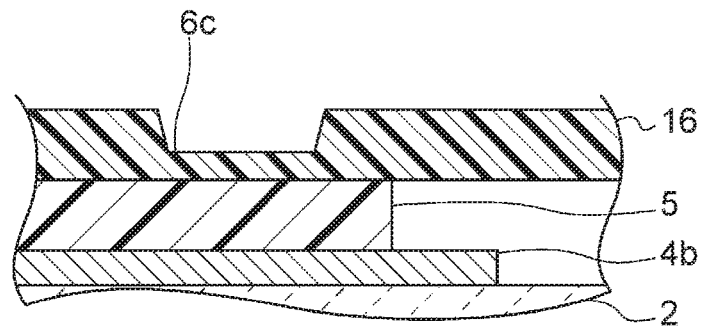
FIG. 9A is a partially cut-away sectional front view illustrating a method for forming recesses in the cover member by performing laser beam irradiation.
Figure 9B:
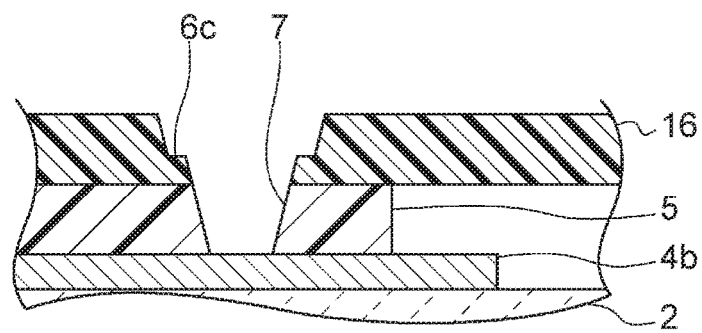
FIG. 9B is a partially cut-away sectional front view illustrating a method for forming via holes by performing laser beam irradiation.

FIG. 9A is a partially cut-away sectional front view illustrating a method for forming the recesses in the cover member by performing laser beam irradiation. FIG. 9B is a partially cut-away sectional front view illustrating a method for forming the via holes by performing laser beam irradiation.

As illustrated in FIG. 9A, the recesses 6c are formed by radiating a laser beam onto the cover member 16. Next, as illustrated in FIG. 9B, the via holes 7 are formed by radiating a laser beam onto the bottom surface of the corresponding recesses 6c. In this case, the diameter of the laser beam used for forming the via holes 7 is set to be smaller than that of the laser beam used for forming the recesses 6c. As a result, the diameters of the via holes 7 are able to be smaller than the diameters of the recesses 6c.

Alternatively, the diameters of the recesses 6c may be increased by causing the laser beam to scan when forming the recesses 6c. In this case, the laser beam that is used when forming the recesses 6c and the laser beam that is used when forming the via holes 7 are able to have the same diameter.

The description will now return to the method for manufacturing the elastic wave device 1 according to the first preferred embodiment. The via conductors 8 are formed by filling the via holes 7 and the recesses 6c of the second cover member 6b, which are illustrated in FIG. 1, with a conductive material. As a result, the first via conductor portions 8a are formed in the via holes 7, and the second via conductor portions 8b are formed in the recesses 6c of the second cover member 6b. A method of forming the via conductors 8 is not particularly limited, and the via conductors 8 may be formed by, for example, a plating method. In the present preferred embodiment, since the inclined surface portions are formed in the recesses 6c of the second cover member 6b and the via holes 7, the first and second via conductor portions 8a and 8b are easily formed.

Next, the bumps 9 are disposed on the second via conductor portions 8a. The second main surface 6aB of the first cover member 6a is covered with the second cover member 6b, which is a protective layer having chemical resistance. Consequently, when the bumps 9 are provided, an organic component that has flowed out of the material of the bumps 9 is less likely to flow into the hollow portion B, which is defined by the piezoelectric substrate 2, the support layer 5, and the cover member 6. Therefore, the probability of defective elastic wave devices being manufactured is significantly reduced.

Next, individual elastic wave devices 1 are obtained by cutting the piezoelectric substrate 2.

Figure 10:
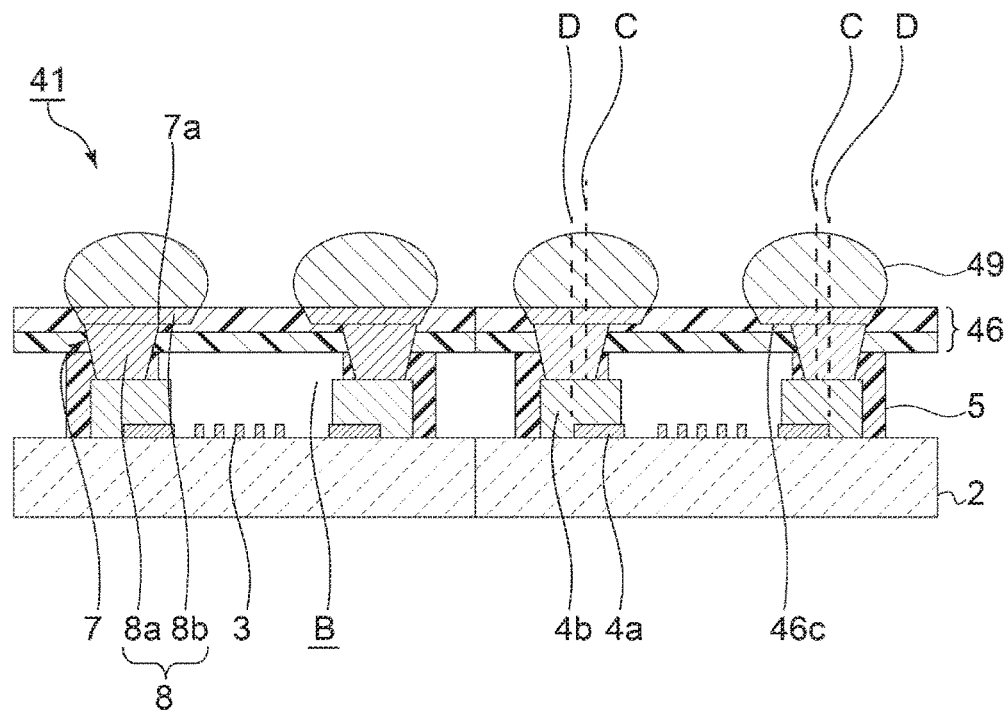
FIG. 10 is a schematic sectional front view illustrating a sixth modification of the elastic wave device according to the first preferred embodiment.

In addition, as in an elastic wave device 41, which is a sixth modification illustrated in FIG. 10, the central axis C of each recess 46c of a cover member 46 may be located inside the central axis D of a corresponding one of the via holes 7 in the width direction. Since bumps 49 are each positioned on a corresponding one of the recesses 46c of the cover member 46, the bumps 49 are also located internally in the width direction. Accordingly, the distance between adjacent bumps 49 of the elastic wave device 41 before the piezoelectric substrate 2 is cut is able to be increased. Thus, the piezoelectric substrate 2 is even more easily cut. Therefore, the probability of defective elastic wave devices being manufactured is significantly reduced. In addition, since the necessary area is reduced, the elastic wave device 41 is able to be reduced in size. Furthermore, the degree of freedom in design is also significantly increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate;
a functional electrode that is disposed on the piezoelectric substrate;
a support layer that is disposed on the piezoelectric substrate and surrounds the functional electrode; and
a cover member that is disposed on the support layer, seals an opening of the support layer, and includes a first main surface facing the support layer and a second main surface opposite to the first main surface; wherein
a recess is located in the cover member and is open to the second main surface;
a via hole extends through the support layer and to a bottom surface of the recess of the cover member, the via hole including an opening that is open to the bottom surface;
an area of the opening of the via hole is less than an area of the bottom surface of the recess of the cover member;
the elastic wave device further includes a via conductor;
the via conductor includes a first via conductor portion that is provided in the via hole and a second via conductor portion that is provided in the recess of the cover member;
a bump is bonded to an end portion of the second via conductor portion opposite to an end portion of the second via conductor portion that faces the first via conductor portion;
the cover member includes a first cover member and a second cover member;
the second cover member is laminated on the first cover member;
the recess of the cover member is located in the second cover member so as not to extend to the first cover member;
the first cover member is a resin layer that is bonded to the second cover member and the support layer; and
the second cover member is a resin layer that protects the first cover member.

2. The elastic wave device according to claim 1, wherein the functional electrode is an interdigital transducer electrode.

3. The elastic wave device according to claim 1, further comprising a first wiring layer and a second wiring layer provided on the piezoelectric substrate.

4. The elastic wave device according to claim 3, wherein the first wiring layer is connected to the functional electrode and the second wiring layer is connected to the first wiring layers and the via conductor portion.

5. The elastic wave device according to claim 3, wherein the support layer is in contact with the second wiring layer.

6. The elastic wave device according to claim 1, wherein the support layer has a frame shape.

7. The elastic wave device according to claim 1, further comprising a hollow portion defined by the piezoelectric substrate, the support layer and the cover member.

8. The elastic wave device according to claim 1, wherein the recess includes an inclined surface.

9. The elastic wave device according to claim 1, wherein the via hole includes an inclined surface.

10. The elastic wave device according to claim 1, wherein a top surface of the second via conductor portion has a protruding shape.

11. The elastic wave device according to claim 10, wherein the resin layer of the second cover member includes a resin that has chemical resistance.

12. The elastic wave device according to claim 10, wherein the resin layer of the first cover member includes a resin that has an adhesive property.

13. The elastic wave device according to claim 12, wherein the resin layer of the second cover member includes a resin that has chemical resistance.

\* \* \* \* \*